United States Patent
Chapman

(10) Patent No.: US 10,637,514 B1
(45) Date of Patent: *Apr. 28, 2020

(54) RECEIVER WITH MULTI-SPECTRUM PARALLEL AMPLIFICATION

(71) Applicant: Interstate Electronics Corporation, Anaheim, CA (US)

(72) Inventor: David Duane Chapman, Fountain Valley, CA (US)

(73) Assignee: Interstate Electronics Corporation, Anaheim, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/261,411

(22) Filed: Jan. 29, 2019

Related U.S. Application Data

(63) Continuation of application No. 15/960,414, filed on Apr. 23, 2018, now Pat. No. 10,200,068, which is a continuation of application No. 15/234,901, filed on Aug. 11, 2016, now Pat. No. 9,979,420, which is a
(Continued)

(51) Int. Cl.
| | |
|---|---|
| *H04B 1/00* | (2006.01) |
| *H03F 1/02* | (2006.01) |
| *H04L 12/26* | (2006.01) |
| *H04L 27/00* | (2006.01) |
| *H04W 52/52* | (2009.01) |
| *H03F 3/19* | (2006.01) |

(Continued)

(52) U.S. Cl.
CPC ......... *H04B 1/0078* (2013.01); *H03F 1/0205* (2013.01); *H03F 3/189* (2013.01); *H03F 3/19* (2013.01); *H04B 1/0057* (2013.01); *H04B 1/26* (2013.01); *H04L 27/0002* (2013.01); *H04L 43/028* (2013.01); *H04W 52/52* (2013.01); *H03F 2200/111* (2013.01); *H03F 2200/294* (2013.01)

(58) Field of Classification Search
None
See application file for complete search history.

(56) References Cited

U.S. PATENT DOCUMENTS

| | | | |
|---|---|---|---|
| 1,087,892 A | 2/1914 | Schloemilch et al. | |
| 1,517,057 A | 11/1924 | Grimes | |
| 1,517,058 A | 11/1924 | Grimes | |

(Continued)

FOREIGN PATENT DOCUMENTS

DE 293300 2/1913

OTHER PUBLICATIONS

Fada Radio & Electric Co., Inc.; Schematic of FADA Model 160 [online]; Pre 1932, [retrieved on Jan. 3, 2014]; retrieved from the Internet: <URL: http://www.nostalgiaair.org/PagesByModel/731/M0039731.pdf>.

(Continued)

*Primary Examiner* — Lana N Le
(74) *Attorney, Agent, or Firm* — Knobbe, Martens, Olson & Bear LLP

(57) ABSTRACT

A radio receiver has a front end having a shared amplification path for both radio frequency signals and intermediate frequency signals. In one example, the shared amplification path can include a low noise amplifier and an attenuator. By amplifying both radio frequency (RF) signals and intermediate frequency (IF) signals with the same shared amplification path, gains in power efficiency, and reductions in cost and circuit size can be achieved.

26 Claims, 8 Drawing Sheets

Related U.S. Application Data continuation of application No. 14/466,307, filed on Aug. 22, 2014, now Pat. No. 9,515,690.

(51) Int. Cl.
*H03F 3/189* (2006.01)
*H04B 1/26* (2006.01)

(56) References Cited

U.S. PATENT DOCUMENTS

| | | | |
|---|---|---|---|
| 1,709,062 A | 4/1929 | Cohen | |
| 1,770,143 A | 7/1930 | Pickard et al. | |
| 2,038,730 A | 4/1936 | Grimes | |
| 2,055,992 A | 9/1936 | Yolles | |
| 2,296,921 A | 9/1942 | Green | |
| 2,508,936 A | 5/1950 | Broos | |
| 2,582,100 A | 1/1952 | Broos | |
| 2,777,056 A | 1/1957 | Bull | |
| 2,778,932 A | 1/1957 | De Cola et al. | |
| 2,843,735 A | 7/1958 | Held | |
| 2,916,616 A | 12/1959 | Boscia | |
| 3,054,955 A | 9/1962 | Wei | |
| 3,069,626 A | 12/1962 | Lungo | |
| 3,138,756 A | 6/1964 | Tarantur | |
| 3,144,611 A | 8/1964 | Kleinman et al. | |
| 3,258,695 A | 6/1966 | Brown, III et al. | |
| 3,316,489 A | 4/1967 | Slavin et al. | |
| 3,398,370 A | 8/1968 | Crump | |
| 3,428,910 A | 2/1969 | Black | |
| 3,502,998 A | 3/1970 | Sikorra | |
| 3,656,162 A | 4/1972 | Mee | |
| 5,956,075 A | 9/1999 | Matsuo | |
| 6,175,327 B1 * | 1/2001 | Lin | H01Q 3/2611 342/357.64 |
| 6,498,926 B1 | 12/2002 | Ciccarelli | |
| 6,704,545 B1 * | 3/2004 | Wala | H04L 51/38 455/16 |
| 6,751,803 B1 | 6/2004 | Matsuura | |
| 7,541,863 B2 | 6/2009 | Vilhonen | |
| 7,558,551 B2 | 7/2009 | Bargroff | |
| 7,983,641 B2 | 7/2011 | Kudo | |
| 8,385,867 B2 | 2/2013 | Rafi | |
| 8,630,601 B2 | 1/2014 | Chandler | |
| 8,780,695 B2 | 7/2014 | Grosso | |
| 8,781,031 B2 * | 7/2014 | Casagrande | H04L 27/1525 375/334 |
| 8,787,864 B2 | 7/2014 | Leung | |
| 8,922,923 B2 | 12/2014 | Steiner | |
| 9,246,664 B1 | 1/2016 | Chapman | |
| 9,356,639 B1 * | 5/2016 | Chapman | H04B 1/28 |
| 9,425,947 B2 | 8/2016 | Kannari | |
| 9,515,690 B1 * | 12/2016 | Chapman | H03F 1/0205 |
| 9,813,169 B2 | 11/2017 | Einzinger | |
| 9,979,420 B1 | 5/2018 | Chapman | |
| 10,200,068 B1 * | 2/2019 | Chapman | H03F 1/0205 |
| 2006/0048197 A1 | 3/2006 | Petruzzelli | |
| 2009/0124227 A1 | 5/2009 | Ishiguro | |
| 2009/0251618 A1 | 10/2009 | Gao | |
| 2010/0130153 A1 | 5/2010 | Khoini-Poorfard | |
| 2010/0148778 A1 * | 6/2010 | Biber | G01R 33/3415 324/318 |
| 2014/0015603 A1 * | 1/2014 | Scott | H03F 1/56 330/126 |
| 2014/0282812 A1 * | 9/2014 | Lu | H04N 7/102 725/149 |
| 2015/0072740 A1 | 3/2015 | Gupta | |
| 2015/0222305 A1 | 8/2015 | May | |
| 2015/0230185 A1 | 8/2015 | Vahid Far | |
| 2015/0249462 A1 * | 9/2015 | Chang | H03M 1/122 398/43 |
| 2018/0070323 A1 | 3/2018 | Zhan | |

OTHER PUBLICATIONS

General Electric Co.; Schematic of GE Model F40 [online]; Oct. 1938, [retrieved on Jan. 3, 2014]; retrieved from the Internet: <URL: http://www.nostalgiaair.org/PagesByModel/791/M0007791.pdf>.

USPTO; Notice of Allowance dated Feb. 12, 2016, from related application U.S. Appl. No. 14/466,275 (filed Aug. 22, 2014).

USPTO; Notice of Allowance dated Jul. 29, 2016, from related application U.S. Appl. No. 14/466,307 (filed Aug. 22, 2014).

USPTO; Office Action dated Sep. 29, 2015, from related application U.S. Appl. No. 14/466,368 (filed Aug. 22, 2014).

Wikipedia; Reflectional Receiver [online], [retrieved on May 19, 2014]; retrieved from the Internet: <URL: http://en.wikipedia.org/wiki/Reflectional_receiver>.

* cited by examiner

RECEIVER WITH MULTI-SPECTRUM PARALLEL AMPLIFICATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application is related to applications titled RECEIVER WITH MULTI-SPECTRUM PARALLEL AMPLIFICATION, Ser. No. 14/466,275, filed Aug. 22, 2014, now U.S. Pat. No. 9,356,639 and RECEIVER WITH MULTI-SPECTRUM PARALLEL AMPLIFICATION, Ser. No. 14/466,368, filed Aug. 22, 2014, now U.S. Pat. No. 9,246,664, the disclosures of each of which are hereby incorporated by reference in their entireties herein.

BACKGROUND

Field of the Invention

The invention generally relates to electronics. In particular, the invention relates to receiver front-end circuits.

Description of the Related Art

Various receiver architectures exist. These architectures include regenerative receivers, direct-conversion receivers, and superheterodyne receivers. Each has its benefits and disadvantages.

One disadvantage of a conventional superheterodyne receiver architecture is that the active component count can be rather high, which can result in a relatively large, expensive, and power-hungry circuit. What is needed is an improved superheterodyne receiver.

SUMMARY OF THE DISCLOSURE

The invention includes a radio receiver front end having a shared amplification path for both radio frequency signals and intermediate frequency signals.

One embodiment includes an apparatus, wherein the apparatus includes: a first N-plexer arranged to perform frequency multiplexing, the first N-plexer comprising: a first port configured to receive signal(s) comprising one or more signals of a radio frequency (RF) band; a second port configured to receive signal(s) comprising one or more signals of an intermediate frequency (IF) band; and a third port configured to provide signals comprising the one or more signals of the RF band and the one or more signals of the IF band; wherein the first N-plexer is configured to substantially isolate the one or more signals of the IF band from the first port; a shared amplification path having an input node and an output node, wherein the input node is coupled to the third port of the first N-plexer, the shared amplification path comprising: a first amplifier; and a controllable attenuator arranged in series with the first amplifier; wherein the shared amplification path is configured to amplify at least both RF signals and IF signals; a second N-plexer arranged to perform frequency demultiplexing, the second N-plexer comprising: a first port coupled to the output node of the shared amplification path to receive signals comprising one or more amplified signals of the RF band and one or more amplified signals of the IF band; a second port configured to provide signal(s) comprising one or more amplified signals of the RF band; and a third port configured to provide signal(s) comprising one or more amplified signals of the IF band, wherein the first port, the second port, and the third port are different ports; a mixer configured to multiply a local oscillator (LO) signal with signal(s) comprising the one or more amplified signals of the RF band to generate a plurality of signals including the one or more signals of the IF band; and an IF filter arranged in a signal path between an output of the mixer and the second port of the first N-plexer, wherein the IF filter is configured to filter the plurality of signals to extract the one or more signals of the IF band and to provide the one or more signals of the IF band to the first N-plexer.

One embodiment includes a method of amplifying a plurality of signals, the method including: receiving signal(s) comprising one or more signals of a radio frequency (RF) band at a first port of a first N-plexer; receiving signal(s) comprising one or more signals of an intermediate frequency (IF) band at a second port of the first N-plexer; frequency multiplexing the signals of the RF band and the IF band to generate multiplexed signals; providing the multiplexed RF and IF band signals at a third port of the first N-plexer; amplifying the multiplexed RF and IF band signals in a shared amplification path to generate one or more amplified signals of the RF band and one or more amplified signals of the IF band, wherein the shared amplification path comprises a first amplifier and a controllable attenuator arranged in series with the first amplifier; receiving signals comprising the one or more amplified signals of the RF band and the one or more amplified signals of the IF band at a first port of a second N-plexer; frequency demultiplexing the one or more amplified signals of the RF band and the one or more amplified signals of the IF band using the second N-plexer; providing signal(s) comprising one or more amplified signals of the RF band at a second port of the second N-plexer; providing signal(s) comprising one or more amplified signals of the IF band at a third port of the second N-plexer; mixing a local oscillator (LO) signal with signal(s) comprising the one or more amplified signals of the RF band to generate a plurality of signals including the one or more signals of the IF band; and filtering the plurality of signals to extract the one or more signals of the IF band and providing the one or more signals of the IF band to the first N-plexer.

One embodiment includes an apparatus for amplifying a plurality of signals, the apparatus including: a means for frequency multiplexing configured to: receive signal(s) comprising one or more signals of a radio frequency (RF) band at a first port; receive signal(s) comprising one or more signals of an intermediate frequency (IF) band at a second port; and provide signals comprising the one or more signals of the RF band and the one or more signals of the IF band at a third port; wherein the frequency multiplexing means is configured to substantially isolate the one or more signals of the IF band from the first port; a shared amplification path having an input node and an output node, wherein the input node is coupled to the third port of the frequency multiplexing means, the shared amplification path comprising a first amplifier and a controllable attenuator arranged in series with the first amplifier wherein the shared amplification path is configured to amplify at least both RF signals and IF signals; a means for frequency demultiplexing configured to: to receive signals comprising one or more amplified signals of the RF band and one or more amplified signals of the IF band at a first port; to provide signal(s) comprising one or more amplified signals of the RF band at a second port; and to provide signal(s) comprising one or more amplified signals of the IF band at a third port; a mixer configured to multiply a local oscillator (LO) signal with signal(s) comprising the one or more amplified signals of the RF band to generate a plurality of signals including the one or more signals of the IF band; and an IF filter arranged in a signal path between an output of the mixer and the second port of the frequency demultiplexing means, wherein the IF filter is configured to filter the plurality of signals to extract the one or more signals of the IF band and to provide the one or more signals of the IF band to the frequency multiplexing means.

One embodiment includes an apparatus, wherein the apparatus includes: a first N-plexer arranged to perform frequency multiplexing, the first N-plexer comprising: a first port configured to receive signal(s) comprising one or more signals of a first radio frequency (RF) band; a second port configured to receive signal(s) comprising one or more signals of a first intermediate frequency (IF) band; and a third port configured to provide signals comprising the one or more signals of the first RF band and the one or more signals of the first IF band; wherein the first N-plexer is configured to substantially isolate the one or more signals of the first IF band from the first port; a shared amplification path having an input node and an output node, wherein the input node is coupled to the third port of the first N-plexer, wherein the shared amplification path comprises an amplifier configured to amplify signals from at least both the first RF band and the first IF band; a second N-plexer arranged to perform frequency demultiplexing, the second N-plexer comprising: a first port coupled to the output node of the shared amplification path, the first port configured to receive signals comprising the one or more amplified signals of the first RF band and the one or more amplified signals of the first IF band; a second port configured to provide signal(s) comprising the one or more amplified signals of the first RF band; and a third port configured to provide signal(s) comprising the one or more amplified signals of the first IF band, wherein the first port, the second port, and the third port are different ports; a mixer configured to multiply a local oscillator (LO) signal with signal(s) comprising the one or more amplified signals of the first RF band to generate a plurality of signals including the one or more signals of the first IF band; a first controllable attenuator arranged in a signal path between the second port of the second N-plexer and an input of the mixer, wherein the first controllable attenuator is configured to set an overall gain of the one or more amplified signals of the first RF band; and a first IF filter arranged in a signal path between an output of the mixer and the second port of the first N-plexer, wherein the first IF filter is configured to filter the one or more signals of the first IF band and to provide the one or more signals of the first IF band to the first N-plexer.

One embodiment includes a method of amplifying a plurality of signals, wherein the method includes: receiving signal(s) comprising one or more signals of a first radio frequency (RF) band at a first port of a first N-plexer; receiving signal(s) comprising one or more signals of a first intermediate frequency (IF) band at a second port of the first N-plexer; frequency multiplexing the signals of the RF band and the IF band to generate multiplexed signals; providing the multiplexed RF and IF band signals at a third port of the first N-plexer; amplifying the multiplexed RF and IF band signals in a shared amplification path to generate one or more amplified signals of the RF band and one or more amplified signals of the IF band, wherein the shared amplification path comprises, wherein the shared amplification path comprises an amplifier; receiving signals comprising the one or more amplified signals of the first RF band and the one or more amplified signals of the first IF band at a first port of a second N-plexer; frequency demultiplexing the one or more amplified signals of the first RF band and the one or more amplified signals of the first IF band using the second N-plexer (112/812); providing signal(s) comprising the one or more amplified signals of the first RF band at a second port of the second N-plexer; providing signal(s) comprising the one or more amplified signals of the first IF band at a third port of the second N-plexer at a third port of the second N-plexer, wherein the first port, the second port, and the third port are different ports; controlling a first attenuator to set an overall gain of the one or more amplified signals of the first RF band; mixing a local oscillator (LO) signal with signal(s) comprising the one or more amplified signals of the first RF band to generate a plurality of signals including the one or more signals of the first IF band; and filtering the one or more signals of the first IF band and providing the one or more signals of the first IF band to the first N-plexer.

One embodiment includes an apparatus for amplifying a plurality of signals, wherein the apparatus includes: a means for frequency multiplexing configured to: receive signal(s) comprising one or more signals of a first radio frequency (RF) band at a first port; receive signal(s) comprising one or more signals of a first intermediate frequency (IF) band at a second port; and provide signals comprising the one or more signals of the first RF band and the one or more signals of the first IF band at a third port; wherein the frequency multiplexing means is configured to substantially isolate the one or more signals of the first IF band from the first port; a shared amplification path having an input node and an output node, wherein the input node is coupled to the third port of the frequency multiplexing means, wherein the shared amplification path comprises an amplifier configured to amplify signals from at least both the first RF band and the first IF band; a means for frequency demultiplexing configured to: to receive signals comprising the one or more amplified signals of the first RF band and the one or more amplified signals of the first IF band at a first port; provide signal(s) comprising the one or more amplified signals of the first RF band at a second port; and provide signal(s) comprising the one or more amplified signals of the first IF band at a third port, wherein the first port, the second port, and the third port are different ports; a mixer configured to multiply a local oscillator (LO) signal with signal(s) comprising the one or more amplified signals of the first RF band to generate a plurality of signals including the one or more signals of the first IF band; a first controllable attenuator arranged in a signal path between the second port of the frequency demultiplexing means and an input of the mixer, wherein the first controllable attenuator is configured to set an overall gain of the one or more amplified signals of the first RF band; and a first IF filter arranged in a signal path between an output of the mixer and the second port of the frequency demultiplexing means, wherein the first IF filter is configured to filter the one or more signals of the first IF band and to provide the one or more signals of the first IF band to the frequency demultiplexing means.

One embodiment includes an apparatus, wherein the apparatus includes: a first N-plexer arranged to perform frequency multiplexing, the first N-plexer comprising: a first port configured to receive signal(s) comprising one or more signals of a first radio frequency (RF) band; a second port configured to receive signal(s) comprising one or more signals of a first intermediate frequency (IF) band; and a third port configured to provide signals comprising the one or more signals of the first RF band and the one or more signals of the first IF band; wherein the first N-plexer is configured to substantially isolate the one or more signals of the first IF band from the first port; a shared amplification path having an input node and an output node, wherein the input node is coupled to the third port of the first N-plexer, wherein the shared amplification path comprises an amplifier configured to amplify signals from at least both the first RF band and the first IF band; a second N-plexer arranged to perform frequency demultiplexing, the second N-plexer comprising: a first port coupled to the output node of the shared amplification path, the first port configured to receive signals comprising the one or more amplified signals of the first RF band and the one or more amplified signals of the first IF band; a second port configured to provide signal(s) comprising the one or more amplified signals of the first RF band; and a third port configured to provide signal(s) comprising the one or more amplified signals of the first IF band, wherein the first port, the second port, and the third port are different ports; a mixer configured to multiply a local oscillator (LO) signal with signal(s) comprising the one or more amplified signals of the first RF band to generate a plurality of signals including the one or more signals of the first IF band; a first controllable attenuator in a signal path downstream of the third port of the second N-plexer, wherein the first controllable attenuator is configured to set an overall gain of the one or more amplified signals of the first IF band; and a first IF filter arranged in a signal path between an output of the mixer and the second port of the first N-plexer, wherein the first IF filter is configured to filter the one or more signals of the first IF band and to provide the one or more signals of the first IF band to the first N-plexer.

One embodiment includes a method of amplifying a plurality of signals, wherein the method includes: receiving signal(s) comprising one or more signals of a first radio frequency (RF) band at a first port of a first N-plexer; receiving signal(s) comprising one or more signals of a first intermediate frequency (IF) band at a second port of the first N-plexer; frequency multiplexing the signals of the RF band and the IF band to generate multiplexed signals; providing the multiplexed RF and IF band signals at a third port of the first N-plexer; amplifying the multiplexed RF and IF band signals in a shared amplification path to generate one or more amplified signals of the RF band and one or more amplified signals of the IF band, wherein the shared amplification path comprises, wherein the shared amplification path comprises an amplifier; receiving signals comprising the one or more amplified signals of the first RF band and the one or more amplified signals of the first IF band at a first port of a second N-plexer; frequency demultiplexing the one or more amplified signals of the first RF band and the one or more amplified signals of the first IF band using the second N-plexer (112/812); providing signal(s) comprising the one or more amplified signals of the first RF band at a second port of the second N-plexer; providing signal(s) comprising the one or more amplified signals of the first IF band at a third port of the second N-plexer at a third port of the second N-plexer, wherein the first port, the second port, and the third port are different ports; controlling a first attenuator to set an overall gain of the one or more amplified signals of the first IF band; mixing a local oscillator (LO) signal with signal(s) comprising the one or more amplified signals of the first RF band to generate a plurality of signals including the one or more signals of the first IF band; and filtering the one or more signals of the first IF band and providing the one or more signals of the first IF band to the first N-plexer.

One embodiment includes an apparatus, wherein the apparatus includes: a first N-plexer arranged to perform frequency multiplexing, the first N-plexer comprising: a first port configured to receive signal(s) comprising one or more signals of a first radio frequency (RF) band and one or more signals of a second RF band; a second port configured to receive signal(s) comprising one or more signals of a first intermediate frequency (IF) band; a fourth port configured to receive signal(s) comprising one or more signals of a second IF band; and a third port configured to provide the signals of the first and second RF bands and the signals of the first and second IF bands in a frequency multiplexed fashion; wherein the first N-plexer is configured to substantially isolate the one or more signals of the first and second IF bands from the first port; a shared amplification path having an input node and an output node, wherein the input node is coupled to the third port of the first N-plexer; a second N-plexer arranged to perform frequency demultiplexing, the second N-plexer comprising: a first port coupled to the output node of the shared amplification path to receive signals comprising one or more amplified signals of the first and second RF bands and one or more amplified signals of the first and second IF bands; a second port configured to provide signal(s) comprising one or more amplified signals of the first and second RF bands; a third port configured to provide signal(s) comprising one or more amplified signals of the first IF band; and a fourth port configured to provide signal(s) comprising one or more amplified signals of the second IF band; a mixer configured to multiply a local oscillator (LO) signal with signal(s) comprising the one or more amplified signals of the first and second RF bands to generate a plurality of signals including the one or more signals of the first and second IF bands; a third N-plexer arranged to perform frequency demultiplexing, the third N-plexer comprising: a first port configured to receive signal(s) comprising the plurality of signals generated by the mixer; a second port configured to provide signal(s) comprising the one or more signals of the first IF band; and a third port configured to provide signal(s) comprising the one or more signals of the second IF band; a first IF filter arranged in a signal path between second port of the third N-plexer and the second port of the first N-plexer, wherein the first IF filter is configured to reject signals outside the first IF band and to provide the one or more signals of the IF band to the first N-plexer; and a second IF filter arranged in a signal path between the third port of the third N-plexer and the fourth port of the first N-plexer, wherein the second IF filter is configured to reject signals outside the second IF band and to provide the one or more signals of the second IF band to the first N-plexer.

One embodiment includes a method of amplifying a plurality of signals, wherein the method includes: receiving signal(s) comprising one or more signals of a first radio frequency (RF) band and one or more signals of a second RF band at a first port of a first N-plexer; receiving signal(s) comprising one or more signals of a first intermediate frequency (IF) band at a second port of the first N-plexer; receiving signal(s) comprising one or more signals of a second IF band at a fourth port of the first N-plexer; frequency multiplexing the signals of the first and second RF bands and signals of the first and second IF bands to generate multiplexed signals; providing the multiplexed signals at a third port of the first N-plexer; amplifying the multiplexed RF and IF band signals in a shared amplification path to generate one or more amplified signals of the each of the first and second RF bands and the first and second IF bands; receiving signals comprising one or more amplified signals of the first and second RF bands and one or more amplified signals of the first and second IF bands at a first port of a second N-plexer; frequency demultiplexing and providing signal(s) comprising one or more amplified signals of the first and second RF bands at a second port of the second N-plexer; frequency demultiplexing and providing signal(s) comprising one or more amplified signals of the first IF band at a third port of the second N-plexer; and frequency demultiplexing and providing signal(s) comprising one or more amplified signals of the second IF band at a fourth port of the second N-plexer; mixing a local oscillator (LO) signal with signal(s) comprising the one or more amplified signals of the first and second RF bands to generate a plurality of signals including the one or more signals of the first and second IF bands; receiving signal(s) comprising the plurality of signals at a first port of a third N-plexer (844); frequency demultiplexing and providing signal(s) comprising the one or more signals of the first IF band at a second port of the third N-plexer (844); and frequency demultiplexing and providing signal(s) comprising the one or more signals of the second IF band at a third port of the third N-plexer (844); filtering the one or more signals of the first IF band and providing the one or more signals of the first IF band to the second port of the first N-plexer; and filtering the one or more signals of the second IF band and providing the one or more signals of the second IF band to the fourth port of the first N-plexer.

One embodiment includes an apparatus, wherein the apparatus includes: a means for frequency multiplexing comprising: a first port configured to receive signal(s) comprising one or more signals of a first radio frequency (RF) band and one or more signals of a second RF band; a second port configured to receive signal(s) comprising one or more signals of a first intermediate frequency (IF) band; a fourth port configured to receive signal(s) comprising one or more signals of a second IF band; and a third port configured to provide the signals of the first and second RF bands and the signals of the first and second IF bands in a frequency multiplexed fashion; wherein the frequency multiplexing means is configured to substantially isolate the one or more signals of the first and second IF bands from the first port; a means for amplifying having an input node and an output node, wherein the input node is coupled to the third port of the frequency multiplexing means; a first means for frequency demultiplexing comprising: a first port coupled to the output node of the shared amplification path to receive signals comprising one or more amplified signals of the first and second RF bands and one or more amplified signals of the first and second IF bands; a second port configured to provide signal(s) comprising one or more amplified signals of the first and second RF bands; a third port configured to provide signal(s) comprising one or more amplified signals of the first IF band; and a fourth port configured to provide signal(s) comprising one or more amplified signals of the second IF band; a mixer configured to multiply a local oscillator (LO) signal with signal(s) comprising the one or more amplified signals of the first and second RF bands to generate a plurality of signals including the one or more signals of the first and second IF bands; a second means for demultiplexing comprising: a first port configured to receive signal(s) comprising the plurality of signals generated by the mixer; a second port configured to provide signal(s) comprising the one or more signals of the first IF band; and a third port configured to provide signal(s) comprising the one or more signals of the second IF band; a first IF filter arranged in a signal path between second port of the second demultiplexing means and the second port of the multiplexing means, wherein the first IF filter is configured to reject signals outside the first IF band and to provide the one or more signals of the IF band to the multiplexing means; and a second IF filter arranged in a signal path between the third port of the second demultiplexing means and the fourth port of the multiplexing means, wherein the second IF filter is configured to reject signals outside the second IF band and to provide the one or more signals of the second IF band to the multiplexing means.

BRIEF DESCRIPTION OF THE DRAWINGS

These drawings and the associated description herein are provided to illustrate specific embodiments and are not intended to be limiting.

In this description, reference is made to the drawings in which like reference numerals may indicate identical or functionally similar elements.

DETAILED DESCRIPTION OF SPECIFIC EMBODIMENTS

A radio receiver has a front end having a shared amplification path for both radio frequency signals and intermediate frequency signals. In one example, the shared amplification path can include a low noise amplifier and an attenuator. By amplifying both radio frequency (RF) signals and intermediate frequency (IF) signals with the same shared amplification path, gains in power efficiency, and reductions in cost and circuit size can be achieved.

The receiver can be used anywhere that radio receivers are used, such as, but not limited to, receivers for a global navigation satellite system (GNSS) such as the global positioning system (GPS), Glonass, Galilio, or Beidou, cellular telephony, computers, laptops, smart phones, tablets, data communications devices, radios, televisions, cable modems, set top boxes, digital subscriber line (DSL) modems, satellite or terrestrial over-the-air broadcasting of data signals or television signals, two-way radios, wireless computer networks such as WiFi (IEEE 802.11), bluetooth (IEEE 802.15.1), cordless telephones, radio control toys, baby monitors, RADAR, repeaters, implantable medical devices, wireless memory cards, and the like.

Although particular embodiments are described herein, other embodiments of the invention, including embodiments that do not provide all of the benefits and features set forth herein, will be apparent to those of ordinary skill in the art.

Figure 1:
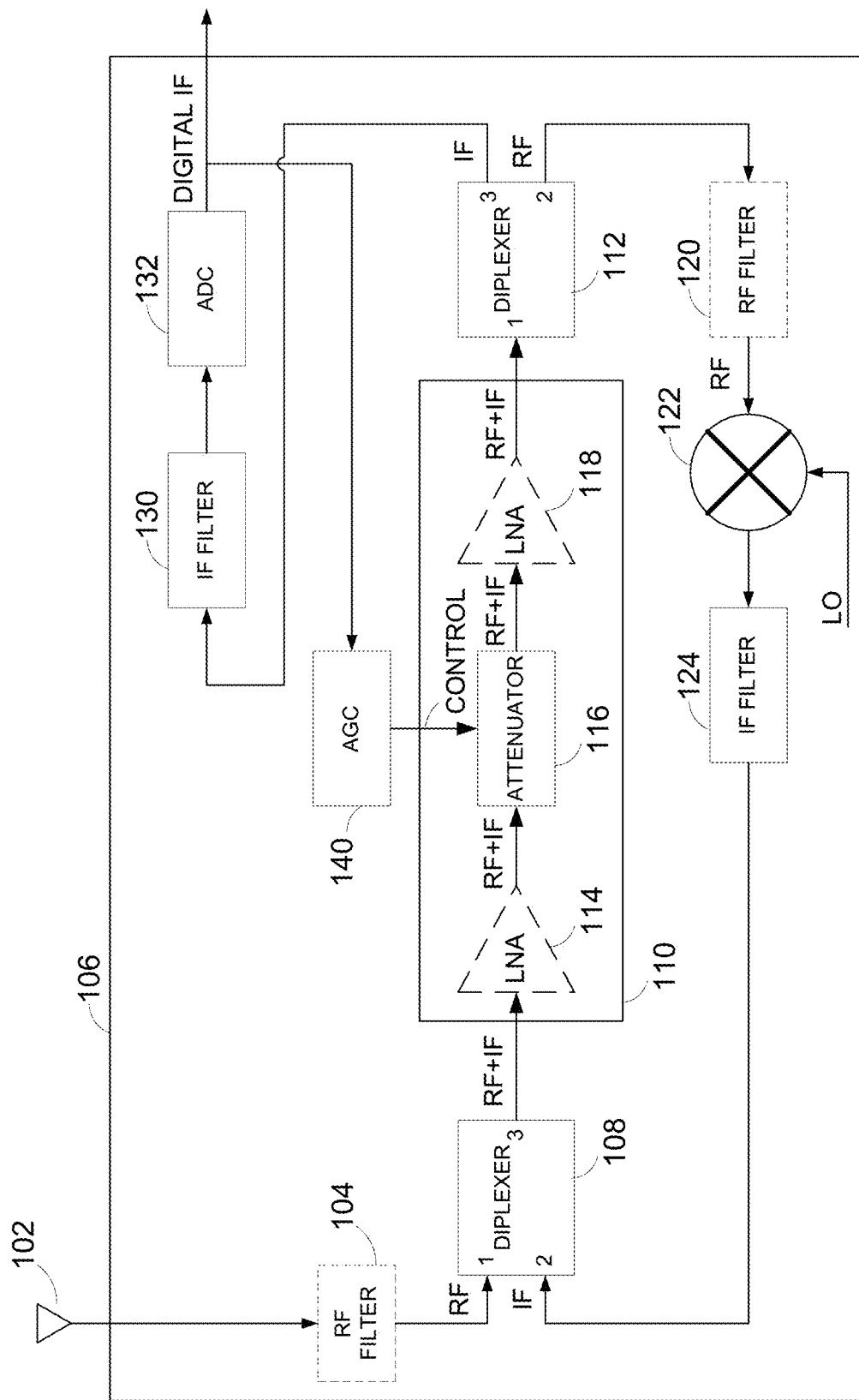
FIG. 1 is a schematic diagram illustrating a front end of a receiver according to an embodiment of the invention in which a shared amplification path includes both an amplifier and an attenuator.

FIG. 1 is a schematic diagram illustrating a front end 106 of a superheterodyne receiver according to an embodiment of the invention. The receiver can include other components not shown, despreaders, demodulators, impedance transform circuits and the like. For example, impedance transform circuits can be used for impedance matching and/or for deliberate impedance mismatching. FIG. 1 illustrates an antenna 102 and the front end 106. The illustrated front end 106 optionally includes an RF filter 104 and includes a first diplexer 108, a shared amplification path 110, a second diplexer 112, an optional RF filter 120, a mixer 122, an IF filter 124, and an IF filter 130, an analog-to-digital converter (ADC) 132, and an automatic gain control (AGC) circuit 140.

The illustrated shared amplification path 110 includes a first low-noise amplifier (LNA) 114, a controllable attenuator 116, and a second LNA 118. One of the first LNA or the second LNA 118 can be optional. In the illustrated embodiment, the first LNA 114 and the second LNA 118 are both fixed gain amplifiers, and gain adjustment is performed by the controllable attenuator 116.

Operation of the front end 106 and associated components will now be described. Initially, a top-level overview will be described followed by a more detailed description. An RF signal is applied as an input to the first diplexer 108, passes through to the output of the first diplexer 108 and to the shared amplification path 110, which amplifies and attenuators the RF signal. The amplified RF signal then passes through the second diplexer 112 to the mixer 122, which generates the IF signal by downconversion of the amplified RF signal. The IF signal then passes through the first diplexer 108 and is amplified and attenuated by the shared amplification path 110. The amplified IF signal passes through the second diplexer 112 to be converted to digital form by the ADC 132, which generates a digital IF signal, which is then monitored by an automatic gain control (AGC) circuit 140 to control gain by adjustment of the amount of attenuation by the controllable attenuator 116. The controllable attenuator 116 can be a digital attenuator, that is, a digitally controlled attenuator. Because of the two passes through the shared amplification path 110, the step size of attenuation by the controllable attenuator 116 is twice the usual amount.

One or more RF signals is received by the antenna 102. While illustrated with antennas in FIGS. 1-5, the principles and advantages disclosed herein are also applicable to wired systems. Optionally, an RF filter 104 can be included to help filter out undesired signals. In one example, the RF filter 104 can be implemented by a surface acoustic wave (SAW) filter, which can assist in filtering out electromagnetic interference (EMI) generated by the receiver. However, other types of filters can be used and will be readily determined by one of ordinary skill in the art. In certain embodiments, the antenna 102 can correspond to a controlled reception pattern antenna (CRPA) and can have multiple elements, each with a RF front end for beamforming/nulling.

The first diplexer 108 is arranged to perform frequency multiplexing. While illustrated with diplexers 108, 112, the principles and advantages disclosed herein are applicable to N-plexers wherein the value of N can vary in a very broad range. When N is equal to 2 as shown in FIG. 1, an N-plexer can be called a diplexer. When N is equal to 3, an N-plexer can be called a triplexer. When N is equal to 4, an N-plexer can be called a quadplexer, and so on. These N-plexers can be used for either frequency multiplexing or demultiplexing depending on how they are arranged. N-plexers are frequency selective and are typically implemented with inductors and capacitors, and can include low-pass filters, high-pass filters, band-pass filters, impedance-matching networks, or the like. N-plexers are different from combiners/splitters, which are typically not frequency selective. N-plexers have less insertion loss than combiners/splitters.

The first diplexer 108 includes a first port, which receives one or more signals of a RF band from the RF filter 104, a second port, which receives one or more signals of an IF band from the IF filter 124, and a third port that combines and provides the one or more signals of the RF band and the one or more signals of the IF band as an output. For example, the first diplexer 108 can include a high pass filter or band pass filter for RF from the first port to the third port, and a low pass filter or band pass filter for IF from the second port to the third port. The one or more signals of the RF band pass from the first port to the third port of the first diplexer 108 in a substantially unattenuated manner. Advantageously, the first diplexer 108 can substantially isolate the one or more signals of the IF band from the first port to help reduce EMI. This reduction in EMI via the first diplexer 108 is important in a practical receiver implementation because prior implementations of receivers, such as those found in reflex receivers, reflectional amplifiers, and the like, would typically produce too much EMI to implement in a real-world environment.

The shared amplification path 110 has an input node, which is coupled to the third port of the first diplexer 108, and an output node which is coupled to the second diplexer 112. The shared amplification path 110 advantageously amplifies both RF and IF signals to generate one or more amplified signals of the RF band and one or more amplified signals of the IF band.

The second diplexer 112 is arranged to perform frequency demultiplexing on the one or more amplified signals of the RF band and one or more amplified signals of the IF band. The second diplexer 112 includes a first port that receives the one or more amplified signals of the RF band and one or more amplified signals of the IF band from the output node of the shared amplification path 110, a second port that provides one or more amplified signals of the RF band as an output, and a third port that provides one or more amplified signals of the IF band as an output. For example, the second diplexer 112 can include a high pass filter or band pass filter for RF from the first port to the second port, and a low pass filter or band pass filter for IF from the first port to the third port.

An RF filter 120 can be optionally inserted in the signal path between the second port of the second diplexer 112 and the mixer 122. The RF filter 120 can be implemented by a SAW filter, but other types of filters can alternatively be used. The RF filter 120 can provide additional spectrum isolation. The amount of spectrum isolation can vary depending on the application and on system dynamic range used.

The mixer 122 mixes or multiplies a local oscillator (LO) signal with the one or more amplified signals of the RF band to generate a plurality of signals. Multiplication of input signals results in output signals that are sum and difference in frequency between the input signals. In the context of the mixer 122, the result of mixing includes the desired one or more IF signals having a frequency that is the difference in frequency between the LO and the one or more amplified signals of the RF band, and also other signals having a frequency that is the sum of the LO and the one or more amplified signals of the RF band. The mixer 122 can also provide as an output other signals that are not desired in this context, such as bleed through of the LO and bleed through of the signals of the RF band. The IF filter 124 rejects those signals outside the band of the IF signals, and provides the remaining one or more IF signals as an input to the second port of the first diplexer 108. The IF filter 124 can also provide an impedance transform function.

The one or more IF signals pass from the second port to the third port of the first diplexer 108 in a substantially unattenuated manner. The one or more IF signals are then amplified/attenuated by the amplifiers 114, 118 and the controllable attenuator 116 of the shared amplification path 110, and one or more amplified IF signals are provided as an input to the first port of the second diplexer 112.

The one or more amplified IF signals pass from the first port to the third port of the second diplexer 112 in a substantially unattenuated manner. The one or more amplified IF signals can then be filtered by the IF filter 130 for anti-aliasing and provided as an input to the ADC 132. The IF filter 130 can include an impedance transformation. The ADC 132 produces a digital IF signal, which is used by downstream portions of the receiver, such as despreaders, demodulators, or the like. However, in alternative embodiments, the subsequent processing of IF signals can be performed in the analog domain. In the illustrated embodiment, the AGC circuit 140 monitors the digital IF signal and adjusts the attenuation of the controllable attenuator 116 such that the digital IF signal efficiently uses the input range of the ADC 132.

Figure 2:
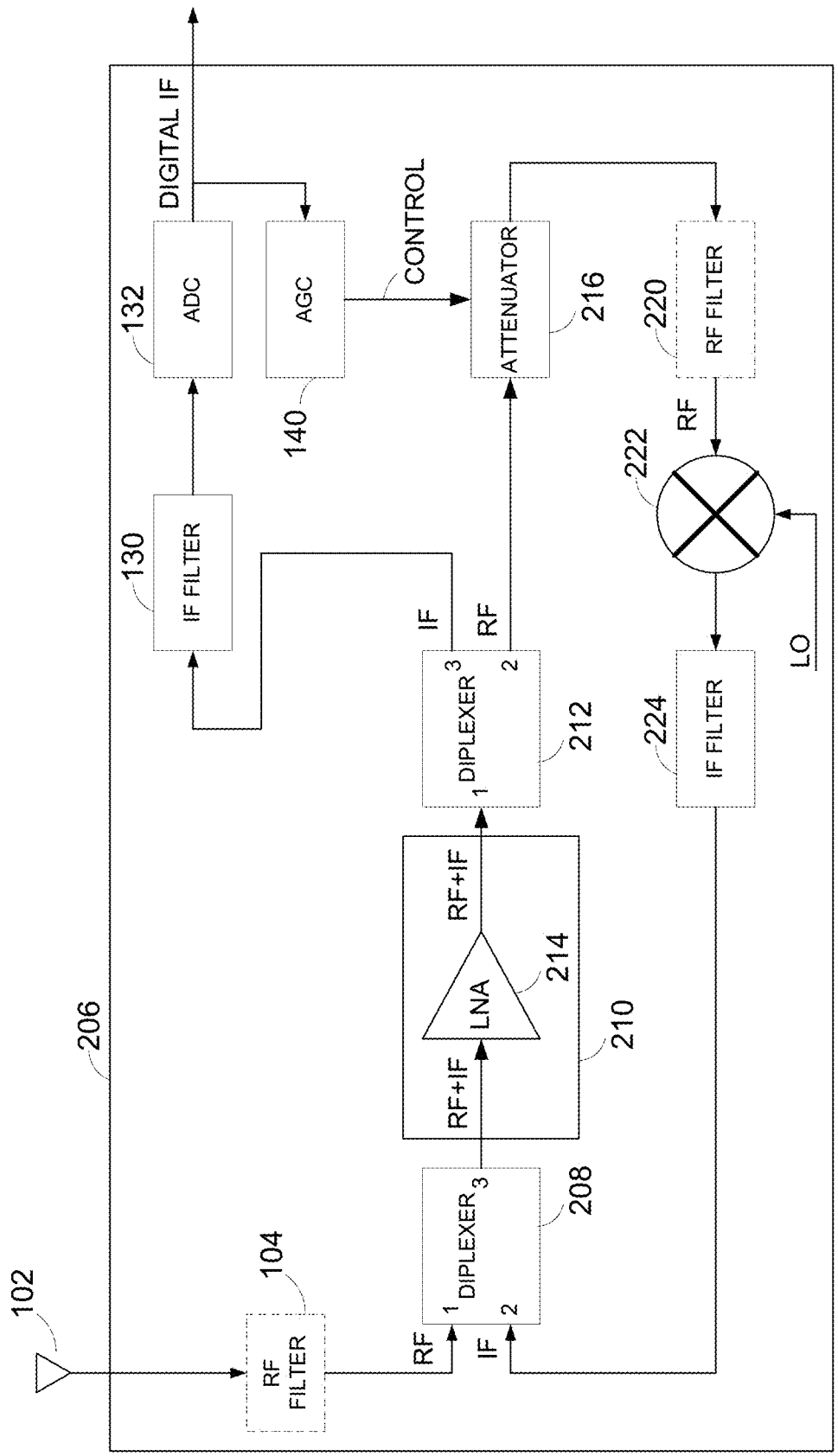
FIG. 2 is a schematic diagram illustrating a front end of a receiver according to an embodiment of the invention wherein an attenuator resides in a radio frequency signal path outside the shared amplification path.

FIG. 2 is a schematic diagram illustrating a front end 206 of a superheterodyne receiver according to another embodiment of the invention. The receiver can include other components not shown, despreaders, demodulators, impedance transform circuits and the like. The front end 206 features an attenuator outside of a shared amplification path 210. FIG. 2 illustrates the antenna 102 and the front end 206. To avoid repetition of description, components having the same or similar function may be referenced by the same reference number.

The illustrated front end 206 optionally includes the RF filter 104 and includes the first diplexer 108, the shared amplification path 210, the second diplexer 112, a controllable attenuator 216, the optional RF filter 120, the mixer 122, the IF filter 124, the IF filter 130, the ADC 132, and the AGC circuit 140. The operation of the front end 206 of FIG. 2 is basically the same as the front-end 106 of FIG. 1 except for the operation of the controllable attenuator 216.

The first diplexer 208 is arranged to perform frequency multiplexing. A first port of the first diplexer 208 receives one or more signals of an RF band. A second port of the first diplexer receives one or more signals of an IF band from the output of the IF filter 224. A third port of the first diplexer 208 combines and provides the one or more signals of the RF band and the one or more signals of the IF band as an output in a substantially unattenuated manner. Advantageously, the first diplexer 208 substantially isolates the one or more signals of the IF band from the first port to help reduce EMI.

The shared amplification path 210 has an input node and an output node, and amplifies signals from both the RF band and the IF band. The input node is coupled to the third port of the first diplexer 208 to receive the signals to be amplified.

The second diplexer 212 is arranged to perform frequency demultiplexing. A first port of the second diplexer 212 is coupled to the output node of the shared amplification path 210 and receives one or more amplified signals of the RF band and one or more amplified signals of the IF band. A second port of the second diplexer 212 provides one or more amplified signals of the RF band as an output, and a third port of the second diplexer 212 provides one or more amplified signals of the IF band as an output.

The one or more amplified signals of the RF band are attenuated by the controllable attenuator 216, which is disposed in a signal path between the second port of the second diplexer 212 and an input of the mixer 222. The controllable attenuator is sets an overall gain of the one or more amplified signals of the RF band, which indirectly controls the gain of one or more signals of an IF band, which are downconverted from the one or more signals of the RF band. It should be noted that in contrast to the controllable attenuator 116 (FIG. 1), the amount of attenuation provided by the controllable attenuator 216 is not doubled.

The mixer 222 multiplies a local oscillator signal (LO) with the one or more amplified signals of the RF band to generate a plurality of signals that includes the one or more signals of the IF band. An optional RF filter 220 can be disposed in a signal path between the second port of the second diplexer 212 and the mixer 222. The RF filter 220 and the controllable attenuator 216 can be arranged in any order between the second port of the second diplexer 212 and the mixer 222.

The IF filter 224 is disposed in a signal path between an output of the mixer 222 and the second port of the first diplexer 208. The IF filter 224 rejects signals outside of the IF band and provides the one or more signals of the IF band to the first diplexer 208. The first diplexer 208 passes the one or more signals of the IF band from the second port to the third port, and the shared amplification path 210 amplifies the one or more signals of the IF band. The one or more amplified signals of the IF band are then passed from the first port of the second diplexer 212 to the third port of the second diplexer 212, and provided as an input to the IF filter 130, then converted to a digital IF signal by the ADC 132 and provided to downstream portions of the receiver. The digital IF signal is also monitored by the AGC circuit 140 to adjust the amount of attenuation provided by the controllable attenuator 216.

Figure 3:
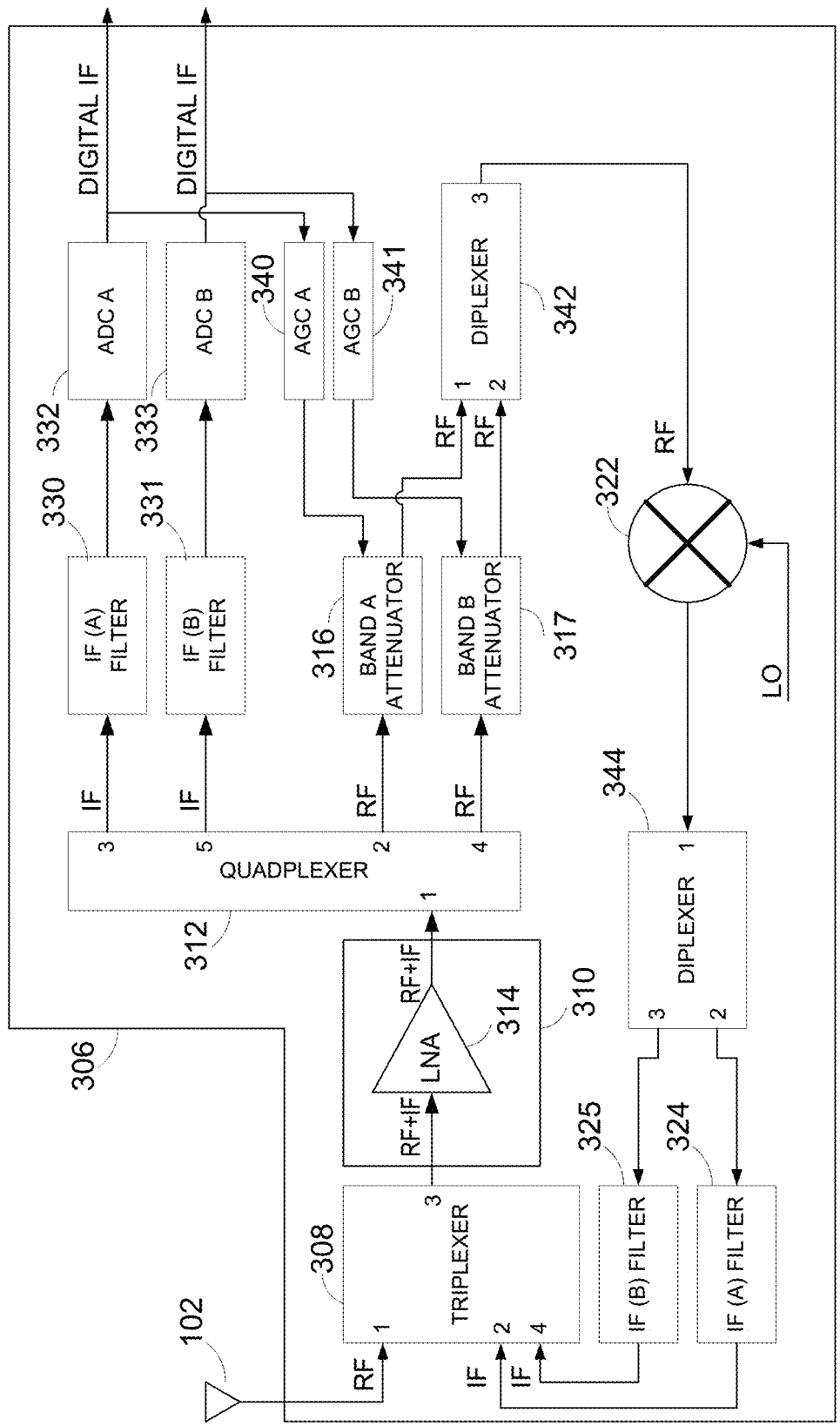
FIG. 3 is a schematic diagram illustrating a front end of a receiver according to an embodiment of the invention with an attenuator in radio frequency (RF) signal paths outside the shared amplification path, with multiple RF and intermediate frequency (IF) bands, and with a single mixer.

FIG. 3 is a schematic diagram illustrating a front end 306 and other components for a superheterodyne receiver according to another embodiment of the invention. The front end 306 receives signals from multiple RF bands and generates signals for multiple IF bands and features attenuators outside of a shared amplification path 310 for independent gain adjustment of the signals of the multiple bands. While illustrated in the context of two RF bands and two IF bands, the principles and advantages disclosed herein can be extended to additional numbers of RF bands and IF bands. The illustrated embodiment is considerably more compact and power efficient than a front end using two separate mixers and having four amplification paths (one for each RF and IF band).

FIG. 3 illustrates the antenna 102 and the front end 306. The front end 306 includes a triplexer 308, the shared amplification path 310, a quadplexer 312, a first controllable attenuator 316, a second controllable attenuator 317, a first diplexer 342, a mixer 322, a second diplexer 344, a first IF filter 324, a second IF filter 325, IF filters 330, 331, ADCs 332, 333 and AGC circuits 340, 341. The receiver can include other components not shown, such as RF filters, despreaders, demodulators, impedance transform circuits and the like. For example, SAW filters can be incorporated into the triplexer 308 to help reduce EMI.

The triplexer 308 is arranged to perform frequency multiplexing and has a first port, a second port, a third port, and a fourth port. The first port receives signals from an antenna or other RF source, such as a cable. The received signals include signals from at least two different RF bands. For example, in the context of GPS, a GPS receiver can receive signals in the L1 band, which is 1575.42 megahertz (MHz), and signals in the L2 band 1227.60 MHz. The GPS satellites transmit at the same frequencies so that multiple different RF signals per band will generally be received by a GPS receiver. The second port receives one or more signals of a first IF band from the output of the first IF filter 324. The fourth port receive one or more signals of a second IF band from the second IF filter 325. The third port of the first diplexer 208 combines and provides the one or more signals of the first and second RF bands and the one or more signals of the first and second IF bands as an output in a substantially unattenuated manner. Advantageously, the first diplexer 208 substantially isolates the one or more signals of the first and second IF bands from the first port to help reduce EMI.

The shared amplification path 310 has an input node and an output node and has at least one amplifier 314, which amplifies both RF signals and IF signals. The input node is coupled to the third port of the triplexer 308 to receive signals for amplification. The output node is coupled to the quadplexer 312.

The quadplexer 312 is arranged to perform frequency demultiplexing and has a first port, a second port, a third port, a fourth port, and a fifth port. The first port is coupled to the output node of the shared amplification path 310 and receives one or more amplified signals of the first and second RF bands and one or more amplified signals of the first and second IF bands. The second port provides the one or more amplified signals of the first RF band as an output. The third port provides the one or more amplified signals of the first IF band as an output. The fourth port provides the one or more amplified signals of the second RF band as an output. The fifth port provides the one or more amplified signals of the second IF band as an output.

The first and second controllable attenuators 316, 317 are arranged in a signal path between the second and fourth ports, respectively, of the quadplexer 312 and the first and second ports of the first diplexer 342. The first controllable attenuator 316 sets an overall gain of the one or more amplified signals of the first RF band and the second controllable attenuator 317 sets an overall gain of the one or more amplified signal of the second RF band. In the illustrated front end 306, each RF band has a separate attenuator for individual gain adjustment of the RF gain, which affects the IF signal level as well.

The first diplexer 342 is arranged to perform frequency multiplexing and has a first port, a second port, and a third port. The first port receives the one or more amplified signals of a first RF band, the second port receives the one or more amplified signals of a second RF band, and the third port combines and provides the one or more amplified signals of the first RF band and the one or more amplified signals of the second RF band as an output in a substantially unattenuated manner.

The mixer 322 has an input coupled to the third port of the first diplexer 342 and multiplies a LO signal with the one or more amplified signals of the first and second RF bands to generate a plurality of signals including the one or more signals of the first and second IF bands. Because the first and second RF bands are at different frequencies, the first and second IF bands will also be at different frequencies. The results of multiplication by the mixer 322 can include other signals that are not desired, such as bleed through of the LO signal, bleed through of the signals of the first and second RF bands and signals having a frequencies that are the sum of the LO frequency and frequencies of the first and second RF bands.

The second diplexer 344 is arranged to perform frequency demultiplexing and has a first port, a second port, and a third port. The second diplexer 344 receives the signals from the mixer 322 and separates the signals from the first IF band from signals from the second IF band. The signals from the first IF band are provided as an output on the second port, and the signals from the second IF band are provided as an output on the third port. However, other signals may accompany the signals from the first IF band and the second IF band.

The first IF filter 324 is arranged in a signal path between second port of the second diplexer 344 and the second port of the triplexer 308. The first IF filter 324 filters the one or more signals of the first IF band to reject those signals outside the first IF band and provides the one or more signals of the first IF band to the triplexer 308.

The second IF filter 325 is arranged in a signal path between an output of the mixer 322 and the fourth port of the triplexer 308. The second IF filter 325 filters the one or more signals of the second IF band to reject those signals outside the second IF band and provides the one or more signals of the second IF band to the triplexer 308.

The triplexer 308 performs frequency multiplexing to combine the signals of the first and second IF bands with the RF signals from the first port, and to provide the combined signals to the shared amplification path 310 via the third port of the triplexer. In this manner, the shared amplification path 310 can amplify the signals of the first and second RF bands and the first and second IF bands.

The amplified signals of the first and second bands are demultiplexed from the other signals by the quadplexer 312, which provides the amplified signals of the first band to the IF filter 330 and the amplified signals of the second band to the IF filter 331. The IF filters 330, 331 can provide anti-aliasing filtering and can also include an impedance transformation. The ADCs 332, 333 produces digital IF signals, which are used by downstream portions of the receiver, such as despreaders, demodulators, or the like. The AGC circuits 340. 341 monitor the digital IF signals and adjusts the attenuation of the controllable attenuators 316, 317 such that the digital IF signals efficiently use the input range of the ADCs 332, 333.

Figure 4:
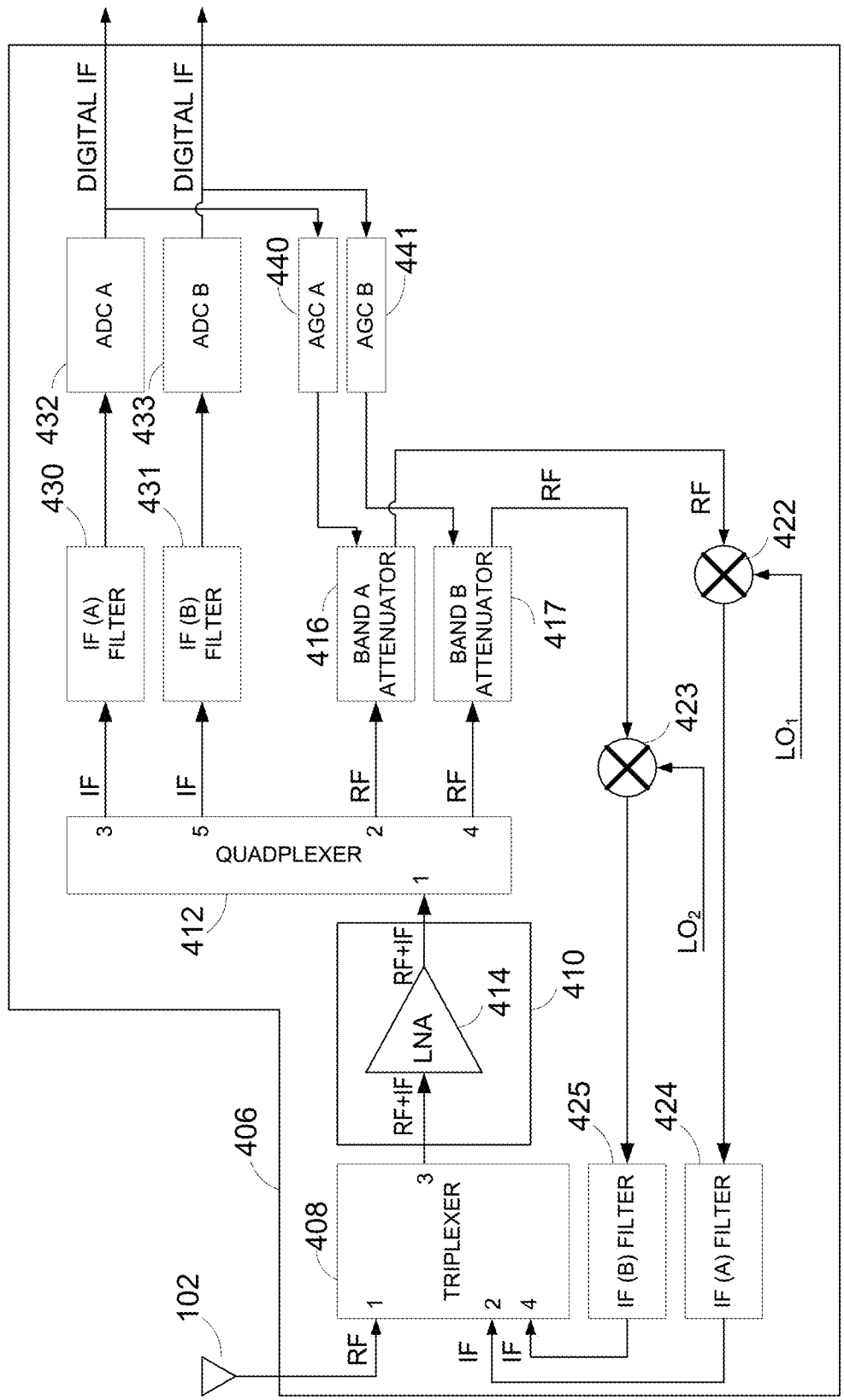
FIG. 4 is a schematic diagram illustrating a front end of a receiver according to an embodiment of the invention with attenuators in radio frequency (RF) signal paths outside the shared amplification path, with multiple RF and intermediate frequency (IF) bands, and with multiple mixers.

FIG. 4 is a schematic diagram illustrating a front end 406 and other components for a superheterodyne receiver according to another embodiment of the invention. Similar to the front end 306 (FIG. 3), the front end 406 receives and amplifies signals from multiple RF and IF bands. However, the front end 406 uses multiple mixers instead of a single mixer. While illustrated in the context of two RF bands and two IF bands, the principles and advantages disclosed herein can be extended to additional numbers of RF bands and IF bands. The illustrated embodiment is more compact and power efficient than a front end having four amplification paths (one for each RF and IF band).

FIG. 4 illustrates the antenna 102 and the front end 406. The receiver can include other components not shown, such as RF filters, despreaders, demodulators, impedance transform circuits and the like. The front end 406 includes a triplexer 408, a shared amplification path 410, a quadplexer 412, a first controllable attenuator 416, a second controllable attenuator 417, a first mixer 422, a second mixer 423, a first IF filter 424, a second IF filter 425, IF filters 430, 431, ADCs 432, 433 and AGC circuits 440, 441.

The triplexer 408 is arranged to perform frequency multiplexing and has a first port, a second port, a third port, and a fourth port. The first port receives signals from an antenna or other RF source, such as a cable. The received signals include signals from at least two different RF bands. The second port receives one or more signals of a first IF band from the output of the first IF filter 424. The fourth port receive one or more signals of a second IF band from the second IF filter 425. The third port of the first diplexer 208 combines and provides the one or more signals of the first and second RF bands and the one or more signals of the first and second IF bands as an output in a substantially unattenuated manner. Advantageously, the first diplexer 208 substantially isolates the one or more signals of the first and second IF bands from the first port to help reduce EMI.

The shared amplification path 410 has an input node and an output node and has at least one amplifier 414, which amplifies both RF signals and IF signals. The input node is coupled to the third port of the triplexer 408 to receive signals for amplification. The output node is coupled to the quadplexer 412.

The quadplexer 412 is arranged to perform frequency demultiplexing and has a first port, a second port, a third port, a fourth port, and a fifth port. The first port is coupled to the output node of the shared amplification path 410 and receives one or more amplified signals of the first and second RF bands and one or more amplified signals of the first and second IF bands. The second port provides the one or more amplified signals of the first RF band as an output. The third port provides the one or more amplified signals of the first IF band as an output. The fourth port provides the one or more amplified signals of the second RF band as an output. The fifth port provides the one or more amplified signals of the second IF band as an output.

The first and second controllable attenuators 416, 417 are arranged in a signal path between the second and fourth ports, respectively, of the quadplexer 412 and the first and second mixers 422, 423. The first controllable attenuator 416 sets an overall gain of the one or more amplified signals of the first RF band and the second controllable attenuator 417 sets an overall gain of the one or more amplified signal of the second RF band. In the illustrated front end 406, each RF band has a separate attenuator for individual gain adjustment of the RF gain, which affects the IF signal level as well.

The first mixer 422 has an input coupled to the first controllable attenuator 416 and multiplies a first LO signal with the one or more amplified signals of the first RF band to generate a plurality of signals including the one or more signals of the first IF band. The results of multiplication by the first mixer 422 can include other signals that are not desired.

The second mixer 423 has an input coupled to the second controllable attenuator 417 and multiplies a second LO signal with the one or more amplified signals of the second RF band to generate a plurality of signals including the one or more signals of the second IF band. The results of multiplication by the second mixer 423 can include other signals that are not desired. The second LO signal has a different frequency than the first LO signal.

The first IF filter 424 is arranged in a signal path between the first mixer 422 and the second port of the triplexer 408. The first IF filter 424 filters the one or more signals of the first IF band to reject those signals outside the first IF band and provides the one or more signals of the first IF band to the triplexer 408.

The second IF filter 425 is arranged in a signal path between the second mixer 423 and the fourth port of the triplexer 408. The second IF filter 425 filters the one or more signals of the second IF band to reject those signals outside the second IF band and provides the one or more signals of the second IF band to the triplexer 408.

The triplexer 408 performs frequency multiplexing to combine the signals of the first and second IF bands with the RF signals from the first port, and to provide the combined signals to the shared amplification path 410 via the third port of the triplexer.

The amplified signals of the first and second bands are demultiplexed from the other signals by the quadplexer 412, which provides the amplified signals of the first band to the IF filter 430 and the amplified signals of the second band to the IF filter 431. The IF filters 430, 431 can provide anti-aliasing filtering and can also include impedance transformations. The ADCs 432, 433 produces digital IF signals, which are used by downstream portions of the receiver, such as despreaders, demodulators, or the like. The AGC circuits 440, 441 monitor the digital IF signals and adjusts the attenuation of the controllable attenuators 416, 417 such that the digital IF signals efficiently use the input range of the ADCs 432, 433.

Figure 5:
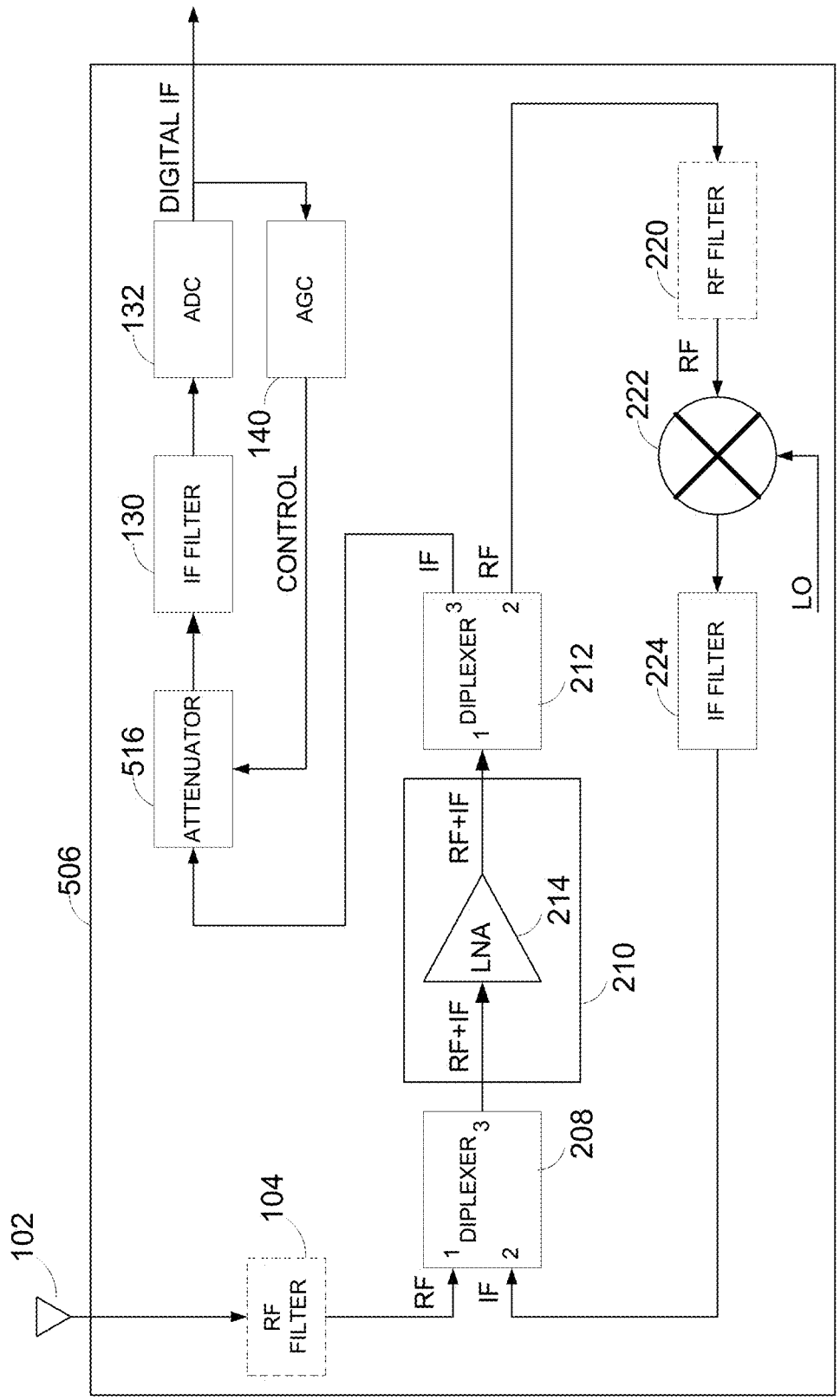
FIG. 5 is a schematic diagram illustrating a front end of a receiver according to an embodiment of the invention wherein an attenuator resides in an intermediate frequency signal path outside the shared amplification path.

FIG. 5 is a schematic diagram illustrating a front end 506 of a receiver according to an embodiment of the invention. The front end 506 can be similar to the front end 206 (FIG. 2) except that the AGC circuit 140 controls an attenuator 516 residing in an intermediate frequency signal path, rather than in an RF signal path as shown in the configuration of FIG. 2. To avoid repetition of description, components having the same or similar function may be referenced by the same reference number.

Figure 6:
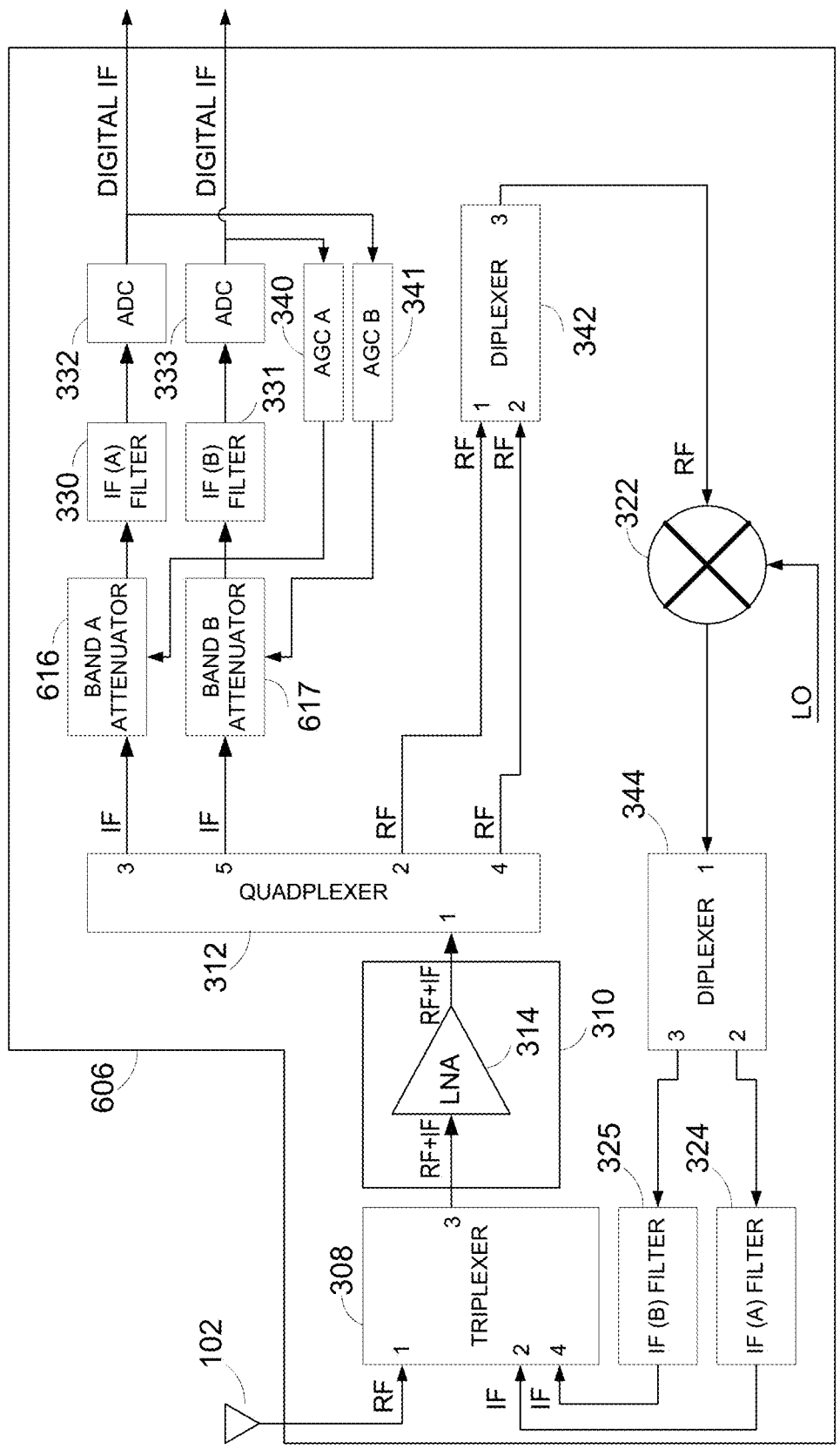
FIG. 6 is a schematic diagram illustrating a front end of a receiver according to an embodiment of the invention with attenuators in intermediate frequency (IF) signal paths outside the shared amplification path, with multiple radio frequency (RF) and IF bands, and with a single mixer.

FIG. 6 is a schematic diagram illustrating a front end 606 of a receiver according to an embodiment of the invention. The front end 606 can be similar to the front end 306 (FIG. 3) except that the AGC circuits 340, 341 control attenuators 616, 617 residing in intermediate frequency (IF) signal paths, rather than in RF signal paths as shown in the configuration of FIG. 3.

Figure 7:
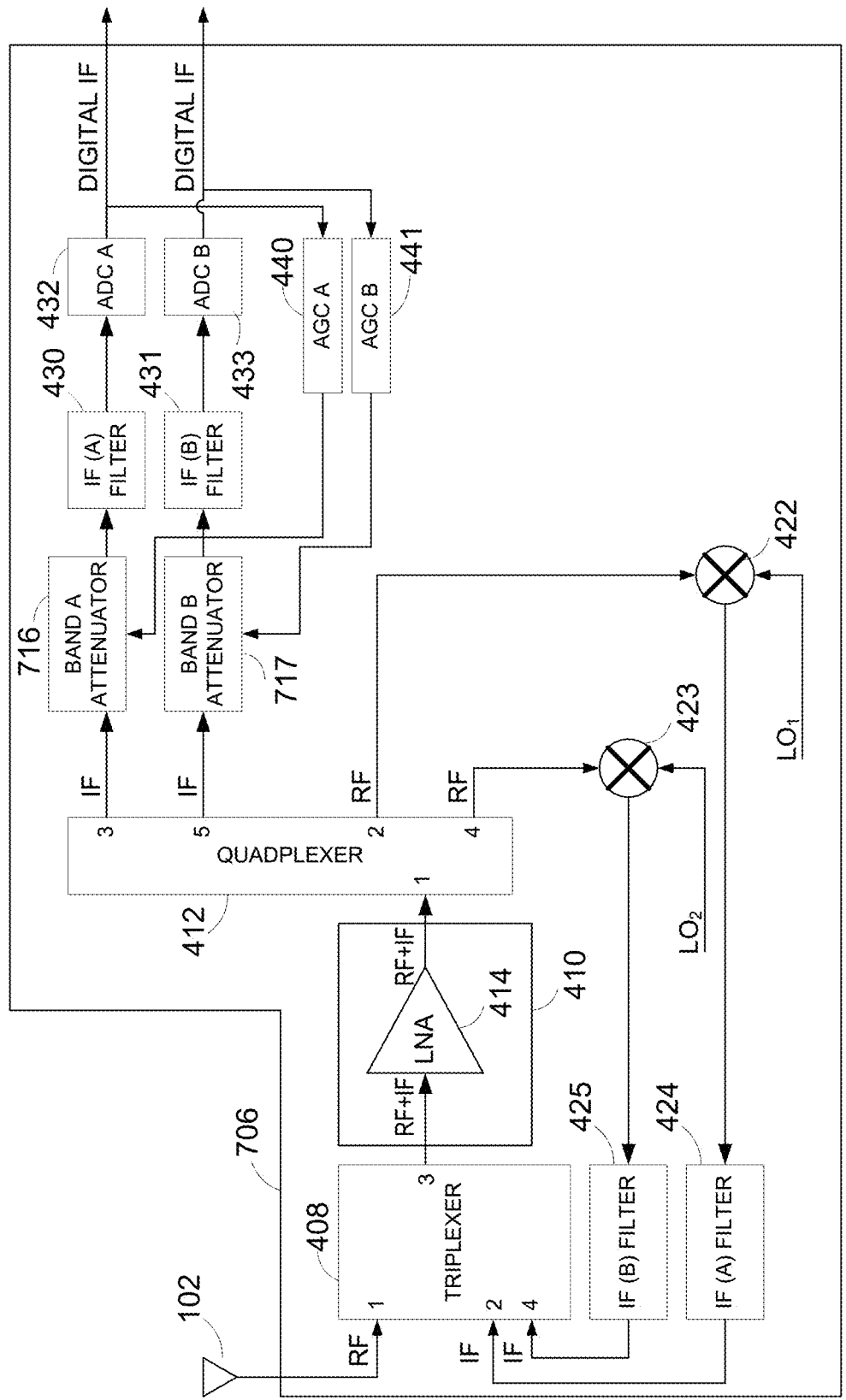
FIG. 7 is a schematic diagram illustrating a front end of a receiver according to an embodiment of the invention with attenuators in intermediate frequency (IF) signal paths outside the shared amplification path, with multiple radio frequency (RF) and IF bands, and with multiple mixers.

FIG. 7 is a schematic diagram illustrating a front end 706 of a receiver according to an embodiment of the invention. The front end 706 can be similar to the front end 406 (FIG. 4) except that the AGC circuits 440, 441 control attenuators 716, 717 in IF signal paths, rather than in RF signal paths as shown in the configuration of FIG. 4. To avoid repetition of description, components having the same or similar function may be referenced by the same reference number.

Figure 8:
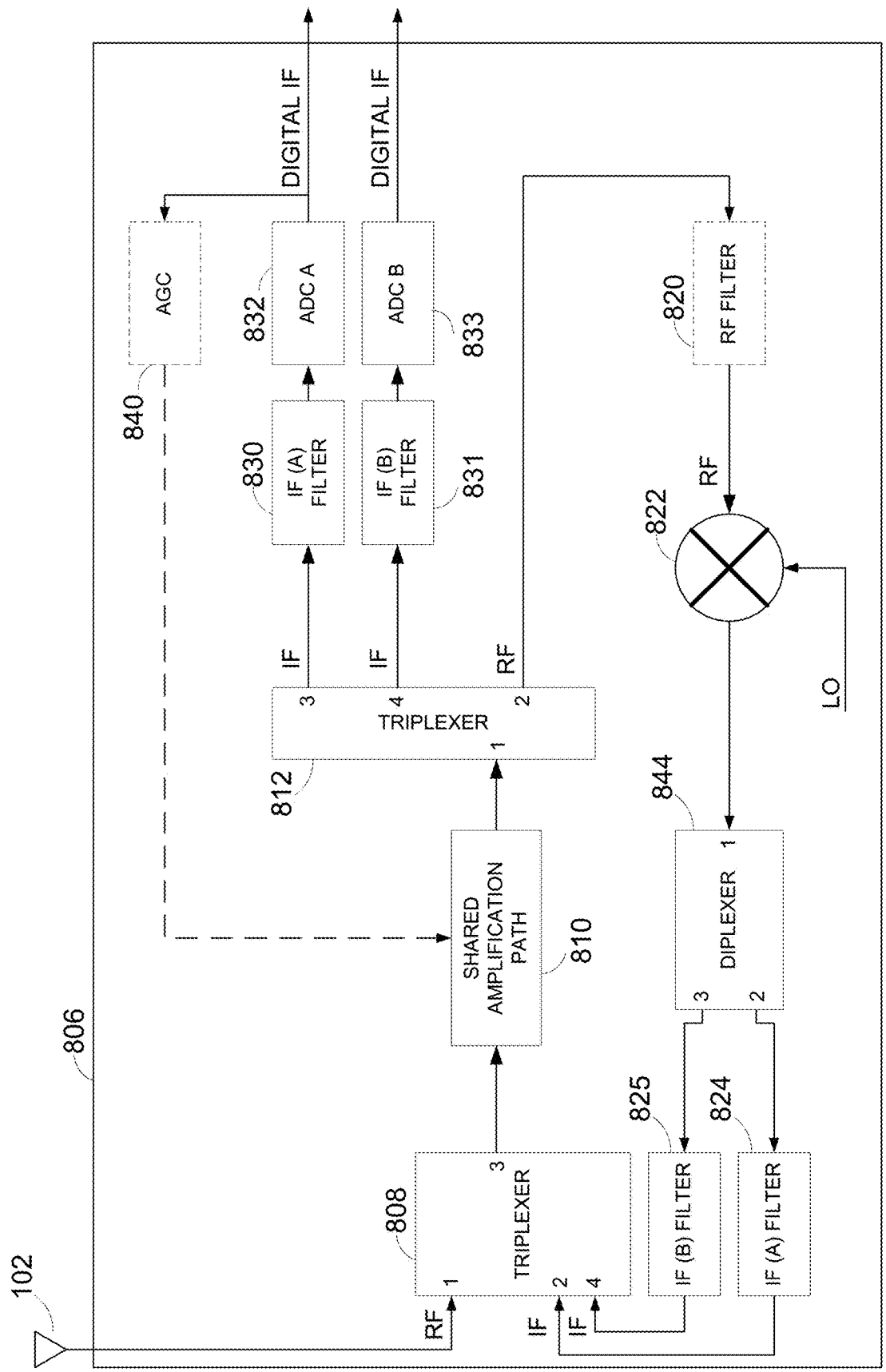
FIG. 8 is a schematic diagram illustrating a front end of a receiver according to an embodiment of the invention with a shared amplification path including both an amplifier and an attenuator, with multiple radio frequency (RF) and intermediate frequency (IF) bands, and with a single mixer.

FIG. 8 is a schematic diagram illustrating a front end 806 and other components for a superheterodyne receiver according to another embodiment of the invention. The front end 806 receives signals from multiple RF bands and generates signals for multiple IF bands. The front end 806 features an attenuator within a shared amplification path 810 for independent gain adjustment of the signals of the multiple bands. While illustrated in the context of two RF bands and two IF bands, the principles and advantages disclosed herein can be extended to additional numbers of RF bands and IF bands and to separate mixers for the different RF bands, and to combinations of separate mixers for separate RF bands and mixers handling more than one RF band.

FIG. 8 illustrates the antenna 102, the front end 806, IF filters 830, 831, ADCs 832, 833 and an AGC circuit 840. The receiver can include other components not shown, such as RF filters, despreaders, demodulators, impedance transform circuits and the like. For example, a SAW filter can be used between the antenna 102 and the front end 806. The front end 806 includes a first triplexer 808, the shared amplification path 810, a second triplexer 812, a mixer 822, a diplexer 844, a first IF filter 824, and a second IF filter 825.

The first triplexer 808 is arranged to perform frequency multiplexing and has a first port, a second port, a third port, and a fourth port. The first port receives signals from an antenna or other RF source, such as a cable. The received signals include signals from at least two different RF bands. The second port receives one or more signals of a first IF band from the output of the first IF filter 824. The fourth port receive one or more signals of a second IF band from the second IF filter 825. The third port of the first diplexer 208 combines and provides the one or more signals of the first and second RF bands and the one or more signals of the first and second IF bands as an output in a substantially unattenuated manner. Advantageously, the first diplexer 208 substantially isolates the one or more signals of the first and second IF bands from the first port to help reduce EMI.

The shared amplification path 810 has an input node and an output node and has at least one amplifier 814, which amplifies both RF signals and IF signals. In one embodiment, the shared amplification path 810 includes at least one amplifier and at least one controllable attenuator. In an alternative embodiment, the shared amplification path 810 includes a variable gain amplifier without an attenuator. In an alternative embodiment, the shared amplification path 810 includes a fixed gain amplifier without an attenuator. The amplifier can be an LNA. In certain embodiments, the amplifiers described herein can be solid state semiconductor or transistor-based amplifiers. The input node is coupled to the third port of the first triplexer 808 to receive signals for amplification. The output node is coupled to the second triplexer 812.

The second triplexer 812 is arranged to perform frequency demultiplexing and has a first port, a second port, a third port, and a fourth port. The first port is coupled to the output node of the shared amplification path 810 and receives one or more amplified signals of the first and second RF bands and one or more amplified signals of the first and second IF bands. The second port provides the one or more amplified signals of the first and second RF bands as an output. The third port provides the one or more amplified signals of the first IF band as an output. The fourth port provides the one or more amplified signals of the second IF band as an output.

The mixer 822 has an input coupled to the second port of the second triplexer 812 and multiplies a LO signal with the one or more amplified signals of the first and second RF bands to generate a plurality of signals including the one or more signals of the first and second IF bands.

The diplexer 844 is arranged to perform frequency demultiplexing and has a first port, a second port, and a third port. The diplexer 844 receives the signals from the mixer 822 and separates the signals from the first IF band from signals from the second IF band. The signals from the first IF band are provided as an output on the second port, and the signals from the second IF band are provided as an output on the third port.

The first IF filter 824 is arranged in a signal path between second port of the diplexer 844 and the second port of the first triplexer 808. The first IF filter 824 filters the one or more signals of the first IF band to reject those signals outside the first IF band and provides the one or more signals of the first IF band to the first triplexer 808.

The second IF filter 825 is arranged in a signal path between an output of the mixer 822 and the fourth port of the first triplexer 808. The second IF filter 825 filters the one or more signals of the second IF band to reject those signals outside the second IF band and provides the one or more signals of the second IF band to the first triplexer 808.

The first triplexer 808 performs frequency multiplexing to combine the signals of the first and second IF bands with the RF signals from the first port, and to provide the combined signals to the shared amplification path 810 via the third port of the first triplexer 808. In this manner, the shared amplification path 810 can amplify the signals of the first and second RF bands and the first and second IF bands.

The amplified signals of the first and second bands are demultiplexed from the other signals by the second triplexer 812, which provides the amplified signals of the first band to the IF filter 830 and the amplified signals of the second band to the IF filter 831. The IF filters 830, 831 can provide anti-aliasing filtering and can also include an impedance transformation. The ADCs 832, 833 produces digital IF signals, which are used by downstream portions of the receiver, such as despreaders, demodulators, or the like. The AGC circuit 840 monitors the digital IF signals and adjusts the attenuation of the controllable attenuator of the shared amplification path 810 such that the digital IF signals efficiently use the input range of the ADCs 832, 833.

As used herein, the term "substantially" intends that the modified characteristic needs not be absolute, but is close enough so as to achieve the advantages of the characteristic. For example, in the context of N-plexers, "substantially unattenuated" can mean less than 2.5 decibels (dB) of insertion loss, less than 2.0 dB of insertion loss, less than 1.5 dB of insertion loss, less than 1.0 dB of insertion loss, or less. In another example, "substantially isolate" can mean isolation of at least 10 dB, 20 dB, 30 dB, or more.

The foregoing description and following claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
   a first N-plexer arranged to perform frequency multiplexing, the first N-plexer comprising:

a first port, the first port configured to receive one or more signals comprising one or more signals of a first radio frequency (RF) band;
a second port, the second port configured to receive one or more signals comprising one or more signals of a first intermediate frequency (IF) band; and
a third port, the third port configured to provide signals comprising the one or more signals of the first RF band and the one or more signals of the first IF band;
a shared amplification path having an input node and an output node, wherein the input node is coupled to the third port of the first N-plexer, wherein the shared amplification path comprises a first amplifier configured to amplify one more signals from at least both:
the first RF band, and
the first IF band;
a second N-plexer arranged to perform frequency demultiplexing, the second N-plexer comprising:
a first port coupled to the output node of the shared amplification path, the first port configured to receive signals comprising:
the one or more amplified signals of the first RF band, and
the one or more amplified signals of the first IF band;
a second port configured to provide one or more signals comprising the one or more amplified signals of the first RF band; and
a third port configured to provide one or more signals comprising the one or more amplified signals of the first IF band, wherein the first port, the second port, and the third port are different ports; and
a mixer configured to multiply a local oscillator (LO) signal with one or more signals comprising the one or more amplified signals of the first RF band to generate a plurality of signals including one or more signals of the first IF band.

2. The apparatus of claim 1, further comprising:
a first IF filter configured to filter one or more IF band signals and to provide the one or more filtered IF band signals to the second port of the first N-plexer.

3. The apparatus of claim 1, where the first N-plexer comprises a fourth port configured to receive one or more signals comprising one or more signals of a second intermediate frequency (IF) band.

4. The apparatus of claim 1, where the shared amplification path comprises an attenuator configured to attenuate signals from the first RF band and the first IF band.

5. The apparatus of claim 1, where the shared amplification path comprises a first attenuator configured to attenuate signals from the first RF band and the first IF band, and the apparatus further comprising:
an analog-to-digital converter configured to convert the one or more amplified signals of the IF band from analog to digital to generate a digitized IF signal; and
an automatic gain control (AGC) circuit configured to control an amount of attenuation of the first controllable attenuator based at least partly on a signal strength of the digitized IF signal.

6. The apparatus of claim 1, wherein the shared amplification path comprises:
an attenuator having an input configured to receive the first amplifier output; and
a second amplifier configured to receive an output of the attenuator.

7. The apparatus of claim 1, wherein the first amplifier comprises a low noise first amplifier.

8. The apparatus of claim 1, the apparatus further comprising:
a first controllable attenuator configured to attenuate RF signals from the second port of the second N-plexer;
an analog-to-digital converter configured to convert the one or more amplified signals of the IF band from analog to digital to generate a digitized IF signal; and
an automatic gain control (AGC) circuit configured to control an amount of attenuation of the first controllable attenuator based at least partly on a signal strength of the digitized IF signal.

9. The apparatus of claim 1, the apparatus further comprising a first attenuator configured to attenuate RF signals from the shared amplification path.

10. The apparatus of claim 1, the apparatus further comprising a first attenuator configured to attenuate IF signals from the shared amplification path.

11. The apparatus of claim 1, wherein the first N-plexer further comprises a fourth port configured to receive one or more signals comprising one or more signals of a second IF band,
wherein the signals received by the first port of the first N-plexer further comprise one or more signals of a second RF band;
wherein the signals provided by the third port of the first N-plexer further comprise the one or more signals of the second RF band; and
wherein the first N-plexer is further configured to substantially isolate the one or more signals of the first IF band and the second IF band from the first port.

12. The apparatus of claim 1, further comprising a surface acoustic wave (SAW) filter disposed in a signal path between an antenna and the first port of the first N-plexer.

13. The apparatus of claim 1, further comprising:
a first controllable attenuator;
a third N-plexer arranged to perform frequency multiplexing;
a fourth N-plexer arranged to perform frequency demultiplexing; and
wherein the first N-plexer further comprises a fourth port configured to receive one or more signals comprising one or more signals of a second IF band,
wherein the signals received by the first port of the first N-plexer further comprise one or more signals of a second RF band;
wherein the signals provided by the third port of the first N-plexer further comprise the one or more signals of the second RF band; and
wherein the first N-plexer is further configured to substantially isolate the one or more signals of the second IF band from the first port;
wherein the second N-plexer further comprises:
a fourth port configured to provide one or more signals comprising one or more amplified signals of the second RF band; and
a fifth port configured to provide one or more signals comprising one or more amplified signals of the second IF band;
wherein the first controllable attenuator is arranged in a signal path between the fourth port of the second N-plexer and the mixer, wherein the first controllable attenuator is configured to set an overall gain of the one or more amplified signals of the second RF band;
wherein the third N-plexer comprises:
a first port configured to receive one or more signals comprising the one or more amplified signals of the first RF band;

a second port configured to receive one or more signals comprising the one or more amplified signals of the second RF band; and a third port configured to provide signals comprising the one or more amplified signals of the first RF band and the one or more amplified signals of the second RF band;

wherein the one or more signals multiplied by the LO signal by the mixer further comprise the one or more amplified signals of the second RF band, wherein the plurality of signals generated by the mixer further includes one or more signals of the second IF band;

wherein the fourth N-plexer comprises:

a first port configured to receive one or more signals comprising the plurality of signals generated by the mixer;

a second port configured to provide one or more signals comprising the one or more signals of the first IF band;

a third port configured to provide one or more signals comprising the one or more signals of the second IF band.

14. The apparatus of claim 1, further comprising:
a first controllable attenuator;
a second mixer; and
wherein the first N-plexer further comprises a fourth port configured to receive one or more signals comprising one or more signals of a second IF band, wherein the signals received by the first port of the first N-plexer further comprise one or more signals of a second RF band;

wherein the signals provided by the third port of the first N-plexer further comprise the one or more signals of the second RF band; and wherein the first N-plexer is further configured to substantially isolate the one or more signals of the second IF band from the first port;

wherein the second N-plexer further comprises:

a fourth port configured to provide one or more signals comprising one or more amplified signals of the second RF band; and a fifth port configured to provide one or more signals comprising one or more amplified signals of the second IF band;

wherein the first controllable attenuator is arranged in a signal path between the fourth port of the second N-plexer and the second mixer, wherein the first controllable attenuator is configured to set an overall gain of the one or more amplified signals of the second RF band;

wherein the second mixer is configured to multiply a second LO signal with one or more signals comprising one or more amplified signals of a second RF band to generate a plurality of signals including one or more signals of a second IF band.

15. A method of amplifying a plurality of signals, the method comprising:

receiving one or more signals comprising one or more signals of a first radio frequency (RF) band at a first port of a first N-plexer;

receiving one or more signals comprising one or more signals of a first intermediate frequency (IF) band at a second port of the first N-plexer;

frequency multiplexing the signals of the first RF band and the first IF band to generate multiplexed RF and IF band signals;

providing the multiplexed RF and IF band signals at a third port of the first N-plexer;

amplifying the multiplexed RF and IF band signals in a shared amplification path to generate one or more amplified signals of the first RF band and one or more amplified signals of the first IF band, wherein the shared amplification path comprises a first amplifier;

receiving signals comprising the one or more amplified signals of the first RF band and the one or more amplified signals of the first IF band at a first port of a second N-plexer;

frequency demultiplexing the one or more amplified signals of the first RF band and the one or more amplified signals of the first IF band using the second N-plexer;

providing one or more signals comprising the one or more amplified signals of the first RF band at a second port of the second N-plexer;

mixing a local oscillator (LO) signal with one or more signals comprising the one or more amplified signals of the first RF band to generate a plurality of signals including one or more signals of the first IF band;

providing one or more signals comprising the one or more amplified signals of the first IF band at a third port of the second N-plexer, wherein the first port, the second port, and the third port are different ports.

16. The method of claim 15, further comprising:
filtering the one or more first IF band signals and providing the one or more filtered IF band signals to the first N-plexer.

17. The method of claim 15, further comprising filtering signals with a surface acoustic wave (SAW) filter, wherein the SAW filter is disposed in a signal path between an antenna and the first port of the first N-plexer.

18. The method of claim 15, further comprising:
converting the one or more amplified signals of the first IF band from analog to digital to generate a digital IF signal; and
controlling an amount of attenuation of a first controllable RF attenuator based at least partly on a signal strength of the digital IF signal.

19. The method of claim 15, further comprising receiving at a fourth port of the first N-plexer one or more signals comprising one or more signals of a second intermediate frequency (IF) band.

20. The method of claim 15, further comprising attenuating signals from the first RF band and the first IF band in a shared attenuation path.

21. The method of claim 15, further comprising:
attenuating signals from the first RF band and the first IF band;
converting, using an analog-to-digital converter, the one or more amplified signals of the first IF band from analog to digital to generate a digitized IF signal; and
using an automatic gain control (AGC) circuit to control an amount of attenuation of the first controllable attenuator based at least partly on a signal strength of the digitized IF signal.

22. The method of claim 15, further comprising:
attenuating the first amplifier output and providing an attenuated output; and
amplifying the attenuated output.

23. The method of claim 15, wherein the first amplifier comprises a low noise first amplifier.

24. The method of claim 15, further comprising:
attenuating RF signals from the second port of the second N-plexer using a first controllable attenuator;

using an analog-to-digital converter the one or more amplified signals of the first IF band from analog to digital to generate a digitized IF signal; and using an automatic gain control (AGC) circuit to control an amount of attenuation of the first controllable attenuator based at least partly on a signal strength of the digitized IF signal.

25. The method of claim 15, further comprising attenuating RF signals or IF signals, or both RF signals and IF signals, from the shared amplification path.

26. The method of claim 15, further comprising receiving one or more signals comprising one or more signals of a second IF band at a fourth port of the first N-plexer, wherein the signals received by the first port of the first N-plexer further comprise one or more signals of a second RF band;

wherein the signals provided by the third port of the first N-plexer further comprise the one or more signals of the second RF band.

* * * * *

UNITED STATES PATENT AND TRADEMARK OFFICE
CERTIFICATE OF CORRECTION

PATENT NO. : 10,637,514 B1  
APPLICATION NO. : 16/261411  
DATED : April 28, 2020  
INVENTOR(S) : David Duane Chapman Page 1 of 1

It is certified that error appears in the above-identified patent and that said Letters Patent is hereby corrected as shown below:

On the Title Page

In Column 2, item (56), Other Publications, Line 3, delete "PagesByMode1" and insert -- PagesByModel --.

In the Specification

In Column 9, Line 2, delete "Galilio" and insert -- Galileo --.

In the Claims

In Column 19, Line 28, Claim 1, delete "band; and" and insert -- band; --.

In Column 23, Line 11, Claim 26, delete "comprising" and insert -- comprising: --.

Signed and Sealed this  
Twenty-first Day of July, 2020

Andrei Iancu  
*Director of the United States Patent and Trademark Office*